(12) United States Patent
Micheloni et al.

(10) Patent No.: US 6,674,385 B2
(45) Date of Patent: Jan. 6, 2004

(54) ANALOG-TO-DIGITAL CONVERSION METHOD AND DEVICE, IN HIGH-DENSITY MULTILEVEL NON-VOLATILE MEMORY DEVICES

(75) Inventors: Rino Micheloni, Turate (IT); Osama Khouri, Milan (IT); Andrea Pierin, Graffignana (IT); Stefano Gregori, Torre d'Isola (IT); Guido Torelli, S. Alessio Con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 46 days.

(21) Appl. No.: 10/060,076

(22) Filed: Jan. 29, 2002

(65) Prior Publication Data

US 2002/0196171 A1 Dec. 26, 2002

Related U.S. Application Data

(63) Continuation of application No. 10/001,918, filed on Oct. 31, 2001, now abandoned.

(30) Foreign Application Priority Data

Oct. 31, 2000 (EP) ............................................. 00830722
Nov. 23, 2000 (EP) ............................................. 00127649

(51) Int. Cl.⁷ .............................................. H03M 1/12
(52) U.S. Cl. .................... 341/155; 714/768; 365/185.01
(58) Field of Search .......................... 341/155; 714/773, 714/768; 365/185.03, 185.21, 185.01

(56) References Cited

U.S. PATENT DOCUMENTS 6,023,781 A * 2/2000 Hazama ...................... 714/773
6,034,888 A   3/2000 Pasotti et al. .......... 365/185.03
6,097,635 A * 8/2000 Chang .................... 365/185.03
6,404,679 B1 * 6/2002 Guedj .................... 365/185.03

FOREIGN PATENT DOCUMENTS

EP        0757355 A1      2/1997

OTHER PUBLICATIONS

Riccö et al., "Nonvolatile Multilevel Memories for Digital Applications," *Proceedings of the IEEE* 86(12):2399–2421, 1998.

* cited by examiner

*Primary Examiner*—Peguy JeanPierre
(74) *Attorney, Agent, or Firm*—Lisa K. Jorgenson; Robert Iannucci; Seed IP Law Group PLLC

(57) ABSTRACT

An analog-to-digital conversion method and device for a multilevel non-volatile memory device that includes a multilevel memory cell. The method comprises a first step of converting the most significant bits contained in the memory cell, followed by a second step of converting the least significant bits. The first step is completed within a time interval corresponding to the rise transient of the gate voltage, and the second step is initiated at the end of the transient. Also disclosed is a scheme for error control coding in multilevel Flash memories. The n bits stored in a single memory cell are organized in different "bit-layers", which are independent from one another. Error correction is carried out separately for each bit-layer. The correction of any failure in a single memory cell is achieved by using a simple error control code providing single-bit correction, regardless of the number of bits stored in a single cell.

19 Claims, 12 Drawing Sheets

ANALOG-TO-DIGITAL CONVERSION METHOD AND DEVICE, IN HIGH-DENSITY MULTILEVEL NON-VOLATILE MEMORY DEVICES

CROSS-REFERENCE TO RELATED APPLICATION

This application is a continuation of U.S. patent application Ser. No. 10/001,918, filed Oct. 31, 2001, now abandoned, which application is incorporated herein by reference in its entirety.

BACKGROUND OF THE INVENTION

1. Field of the Invention

This invention relates to an analog-to-digital conversion method in high-density multilevel non-volatile memory devices, being of the type wherein a reading operation is performed on a multilevel memory cell, comprising a floating gate transistor with drain and source terminals, by applying predetermined bias voltage values to its drain and source terminals while its drain terminal is applied a predetermined current value, and by measuring the value of its gate voltage.

The invention further relates to a device implementing the method.

2. Description of the Related Art

Known are multilevel memory devices which can store plural logic values in a single memory cell. Such devices are in the form of integrated electronic circuits, which have attained a sufficient degree of reliability to allow their manufacture in large volumes for a variety of technical and commercial applications.

Multilevel memory devices are in high demand on the market of semiconductor-integrated electronic devices for the reason that they afford an information storage density which is at least twice as high as that of two-level memory devices, for the same technology and area requirements.

In the light of these considerations, any efforts to develop memory devices that can store a larger number of bits per memory cell are well warranted.

However, this goal clashes with technical problems posed by the very increase in the number of bits stored in a single cell, and by the handling thereof. Also, multilevel memory devices are expected to perform comparably with two-level memory devices, and especially to exhibit the same synchronous and asynchronous access times, same read and program parallelism, and same program and erase speeds.

To best appreciate all the aspects of this invention, the main electrical characteristics of a multilevel memory device will be reviewed briefly herein below.

A different programmed state of a memory cell reflects in a different value of its threshold voltage Vth.

With a two-level cell, there can only be two values, respectively corresponding to a logic "0" and a logic "1". In this operational context, the amount of information that can be stored is of one bit per cell.

By contrast, a multilevel memory cell can store a larger number of bits than one. From the electrical standpoint, this means that the threshold voltage can have more than two values. The amount of information that can be stored in a single multilevel cell increases according to the following relation:

$$n \text{ bits/cell} = \log_2(n \text{ values of } Vth).$$

From a physical standpoint, the ability to alter the threshold voltage Vth, and hence to program the multilevel memory cell, is afforded by the floating gate structure of the transistor which comprises the memory cell. The gate region is isolated in D.C. but accessible through charge injection processes of the Channel Hot Electrons and/or the Fowler-Nordheim Tunneling Effect types.

These processes, when suitably controlled, allow the amount of charge which is caught within the floating gate to be modulated, so that the effect of the latter on the value of the threshold voltage Vth can be altered.

A major problem of multilevel memory handling is that, as the number of the possible programmed states increases, the gap ΔVth between consecutive threshold voltage values decreases dramatically, according to the following relation:

$$\Delta Vth = \Delta Vtot/(n \text{ values of } Vth).$$

In fact, reliability factors forbid an expansion of the overall gap ΔVtot to accommodate the various programmed states beyond 5 to 6V. Furthermore, in view of all the process "spreads" likely to occur, the variations in the operational conditions of the memory device (i.e., supply voltage, temperature, etc.), and the accuracy of the programming processes, the threshold voltage levels are bound to vary somewhat on either sides of their nominal values. It is customary to indicate this situation in terms of different "distributions" of the individual programmed states, rather than "exact values" thereof.

This particular aspect reflects in further narrowing of the nominal gap ΔVth between adjacent programmed states, which requires the accuracy of the circuits concerned with reading the logic information from the cells to be augmented proportionally.

For example, with sixteen-level memory cells, that is cells capable of storing four bits each, the above considerations lead to estimating the actual gap ΔVth at around 200 mV. For typical current gains of the memory cells, on the order of 10 μA/V, the current difference between adjacent programmed states would be about 2 μA.

Under conditions such as these, the read circuitry that incorporates the sense amplifiers has great difficulty to discriminate between programmed states of the cell, unless the read time can be considerably extended, which would lead to degraded performance of the device as regards memory access time.

It should be further added that current-mode sensing schemes may "disturb" the programmed state of an addressed cell and result in progressive alteration of its threshold voltage Vth. This phenomenon is recognized as "read disturb" in the relevant literature. In fact, current-mode reading is achieved by maintaining, on the terminals of the addressed cell, definite bias conditions which are the same for all the cells and, therefore, unrelated to the cell programmed states. These conditions may be, for example: Vg=6 V; Vdrain=1 V; and Vsource=0 V.

In this way, the information contained in the addressed cell can be derived from the cell drain current.

However, these reading bias conditions lead to electric fields being developed between the conduction channel and the floating gate, which fields are the stronger the smaller is the value of the threshold voltage Vth. Unfortunately, these electric fields are sufficiently strong to significantly raise the probability of charge being injected into the floating gate. This phenomenon results in re-programming, as harmful as it is undesired, of the addressed cell and may strike unevenly, since its effectiveness is proportional to the difference between the read voltage Vg and the threshold voltage Vth.

The net outcome of all this is a progressive reduction of the gap ΔVth separating adjacent programmed states, with a consequent loss of reliability which will be the more significant the smaller the gep ΔVth and the larger the number of bits stored in each cell.

It should be considered, moreover, that current-mode reading is affected by the source resistance introducing non-linearity, to the point that the informational contents of a selected cell may be read erroneously.

In the light of the above considerations, the need of a circuit architecture which were effective to read from memory cells having n levels, e.g. sixteen levels, and ensured a read time of less than 100 ns, affording a memory access time on the order of 150 ns, can be fully appreciated.

It also appears from the foregoing considerations that the "current" mode reading approach is inadequate to meet the above requirement.

However, another method of reading the informational contents of a memory cell has been proposed in the art.

This prior approach is a "voltage" mode sensing method which allows the information stored in the cell to be retrieved by determining the cell threshold voltage Vth, or a voltage proportional thereto, usually the gate voltage Vg. In principle, the "voltage" sensing method consists of forcing a suitable drain current (Iref), concurrently with predetermined bias conditions, on the drain and source terminals of the cell (e.g., Vdrain=1 V and Vsource=0 V). These being the conditions for operation, the gate voltage produced by the cell, Vsenseout, is extracted.

This voltage Vsenseout becomes a function of the threshold voltage Vth once the drain current Iref and the current gain Gm of the cell are set, according to the following relation:

$$Vg = Vsenseout = Vth + Gn*Iref.$$

This value univocally represents the programmed state of the cell.

Shown schematically in FIG. 1 of the accompanying drawings is an example of a sense amplifier 1 which is negative-feedback looped to the gate terminal G of a cell 2, so as to control its voltage Vg to the value whereat the drain current of the cell 2 exactly equals the reference current Iref.

It is noteworthy that the degree of reliability would benefit considerably from a circuit like that shown FIG. 1 because of the voltage Vg produced at the gate terminal G of the cell 2 exceeding the threshold voltage Vth by a constant and reasonably small amount (equal to Gm*Iref).

For example, with a value of Gm equal to 20 µA/V and a reference current Iref of 12 µA, a threshold voltage Vth of 600 mV can be obtained.

It follows that any read disturbance on the addressed cell would be quite minor, besides being uniform, i.e. unrelated to the programmed state of the cell.

Thus, "voltage" reading can suppress the "read disturb" effect that deteriorates the gap ΔVth separating adjacent programmed states. This is the approach described in European Patent Application No. 99830071.9 by the Applicant and the Applicant's U.S. Pat. No. 6,034,888.

A gate voltage Vg which has been extracted by this technique must then be converted into a set of bits (e.g., four bits) representing the informational contents from the cell being read.

Assume, by way of example, a sixteen-level programmed cell (four bits per cell), and that a voltage-mode reading approach be used. The four bits which represent the informational contents of the selected cell can be obtained from the gate voltage Vg by means of an A/D conversion device.

Of the most commonly used types of A/D conversions, the "flash" type, so called because of its high rate of conversion, is more suitable.

Fifteen comparators are needed to implement this technique, which comparators should be compensated for offset and capable of comparing a voltage difference of 50 mV, representing the theoretical difference between the gate voltage Vg of a programmed level and its nearest comparative voltage, while also taking temperature variations into account.

FIG. 2 shows a schematic example of a conventional flash A/D converter.

As previously mentioned, a major advantage of this technique resides in its conversion rate, due to its convert time being substantially the compare time of a single comparator.

However, there are also disadvantageous aspects to take into account, as follows:

ample occupation of circuit area; for example, the total area of the converter is equal to the area of one comparator multiplied by fifteen, that is by the number (n−1) of levels;

high power consumption, due to the need of a large number of comparators; also, using fast comparators makes consumption worse, since a higher speed is accompanied by higher consumption, and vice versa.

With the comparators being required to compare higher voltages than the external supply voltage VDD, the comparators must be supplied higher voltages than VDD.

Such voltages are usually generated by charge pump voltage boosters inside the integrated circuit. Charge pump circuits have low efficiencies (less than 40%) and, accordingly, several charge pump stages must be provided to power these comparators, resulting in increased area occupation.

Another A/D conversion technique consists of using a single comparator to compare serially, for each level, the gate and reference voltages, carrying out one comparison after another. This technique does require less area and involve lower consumption, but is evidently made slower by that n steps are necessary to obtain the output bits. The total convert time is n*Tc, where Tc is the compare time of one comparator (e.g., n=15; Tc=10 ns→Ttot=150 ns), clearly resulting in degraded memory access time.

There are further A/D conversion techniques, known as combined techniques, such as dichotomic, successive approximation, serial-parallel techniques, or else.

Summarized in the table herein below are the advantages and disadvantages of all these A/D conversion techniques.

| TECHNIQUE | AREA OCCUPIED | POWER CONSUMPTION | CONVERSION TIME |
|---|---|---|---|
| Flash | Large | High | Minimal about 10 ns |
| Serial | Small | Low | Maximum about 150 ns |
| Successive approximation | Medium | Medium | Medium about 80 ns |
| Combination A/D | Medium | Medium | Medium about 80 ns |

None of the solutions currently used in the state of the art provides a converter capable of combining the converting performance of the flash method with the minimal area requirements and reduced consumption of the serial method.

BRIEF SUMMARY OF THE INVENTION

An embodiment of this invention provides an analog-to-digital conversion method for high-density multilevel nonvolatile memory devices, as well as a conversion device implementing the method, with such functional and structural features as to exhibit short convert time, reduced circuit area requirements, and reduced power consumption.

In other words, the circuit performing the analog-to-digital conversion is to occupy a minimal area on the semiconductor and exhibit very low consumption. Above all, conversion time should be sufficiently short not to degrade the memory access time.

One embodiment of this invention provides a two steps conversion: a first step wherein the most significant bits MSB are converted within a predetermined time window, and a second step wherein the least significant bit LSB are converted within a period of time corresponding to the best solutions of the prior art.

The invention relates to an analog-to-digital conversion method in high-density multilevel non-volatile memory devices, comprising the following steps:

reading a multilevel memory cell, comprising a floating gate transistor with drain and source terminals, by applying predetermined bias voltage values to its drain and source terminals while its drain terminal receives a predetermined current value;

measuring the value of the cell gate voltage;

converting the most significant bits (MSB) contained in the memory cell;

converting the least significant bits (LSB) contained in the memory cell.

The invention further relates to an analog-to-digital conversion device incorporated in high-density multilevel non-volatile memory devices, of the type used for reading the contents of a multilevel memory cell comprising a floating gate transistor with drain and source terminals, and further comprising a plurality of voltage comparators, each having a first input coupled to the floating gate and a second input maintained at a corresponding reference voltage value, the comparator outputs being connected to a logic block for extracting the most significant bits of the cell.

The features and advantages of the conversion method and device according to this invention will be apparent from the following description of embodiments thereof, given by way of non-limiting examples with reference to the accompanying drawings.

DETAILED DESCRIPTION OF THE INVENTION

Figure 5:
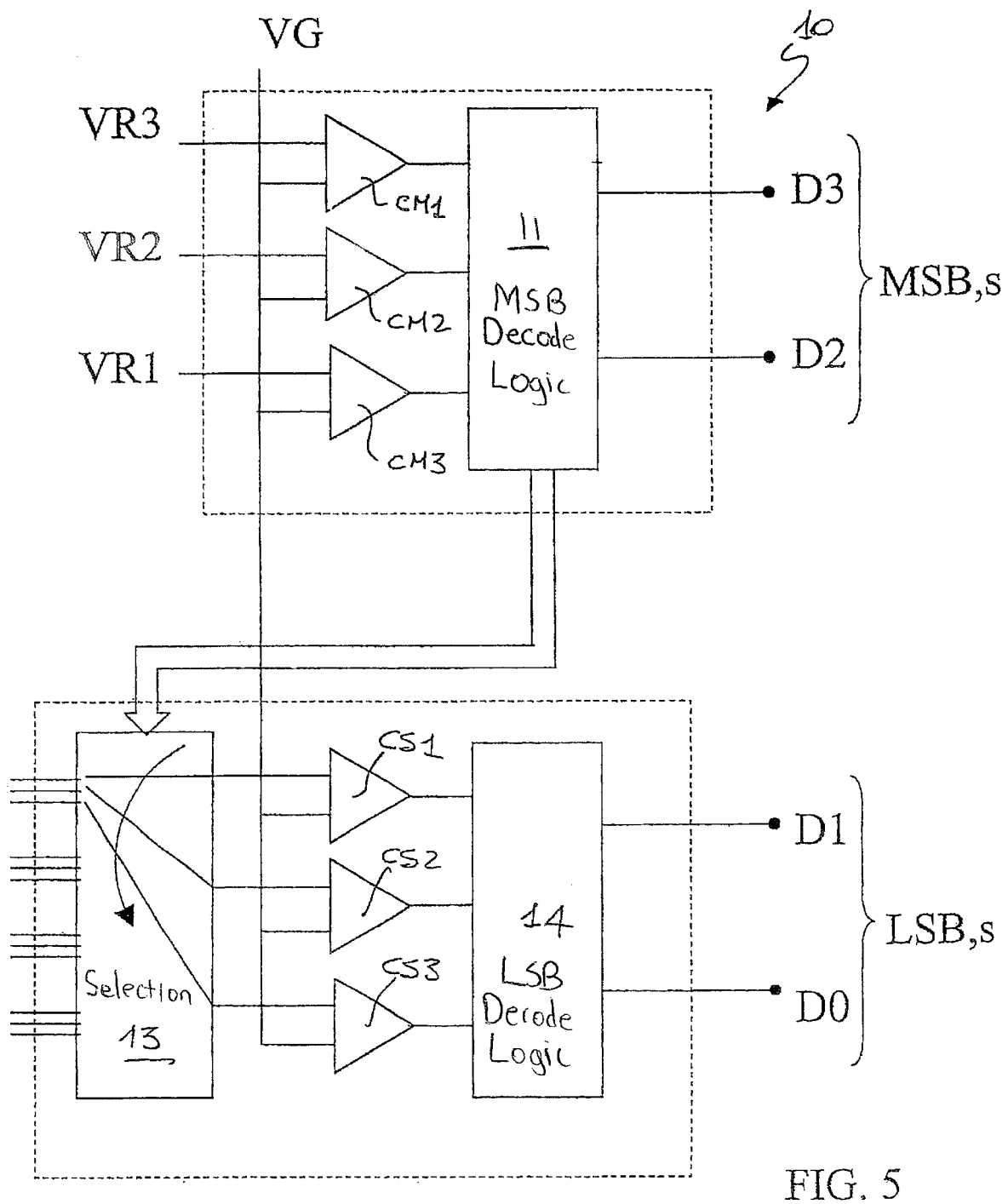
FIG. 5 shows, schematically in block form, a conversion device according to the invention.

With reference to the drawings, in particular to the example shown in FIG. 5, an A/D conversion device for implementing a unique conversion method according to an embodiment of this invention, is shown generally at 10 in schematic form.

Figure 8:
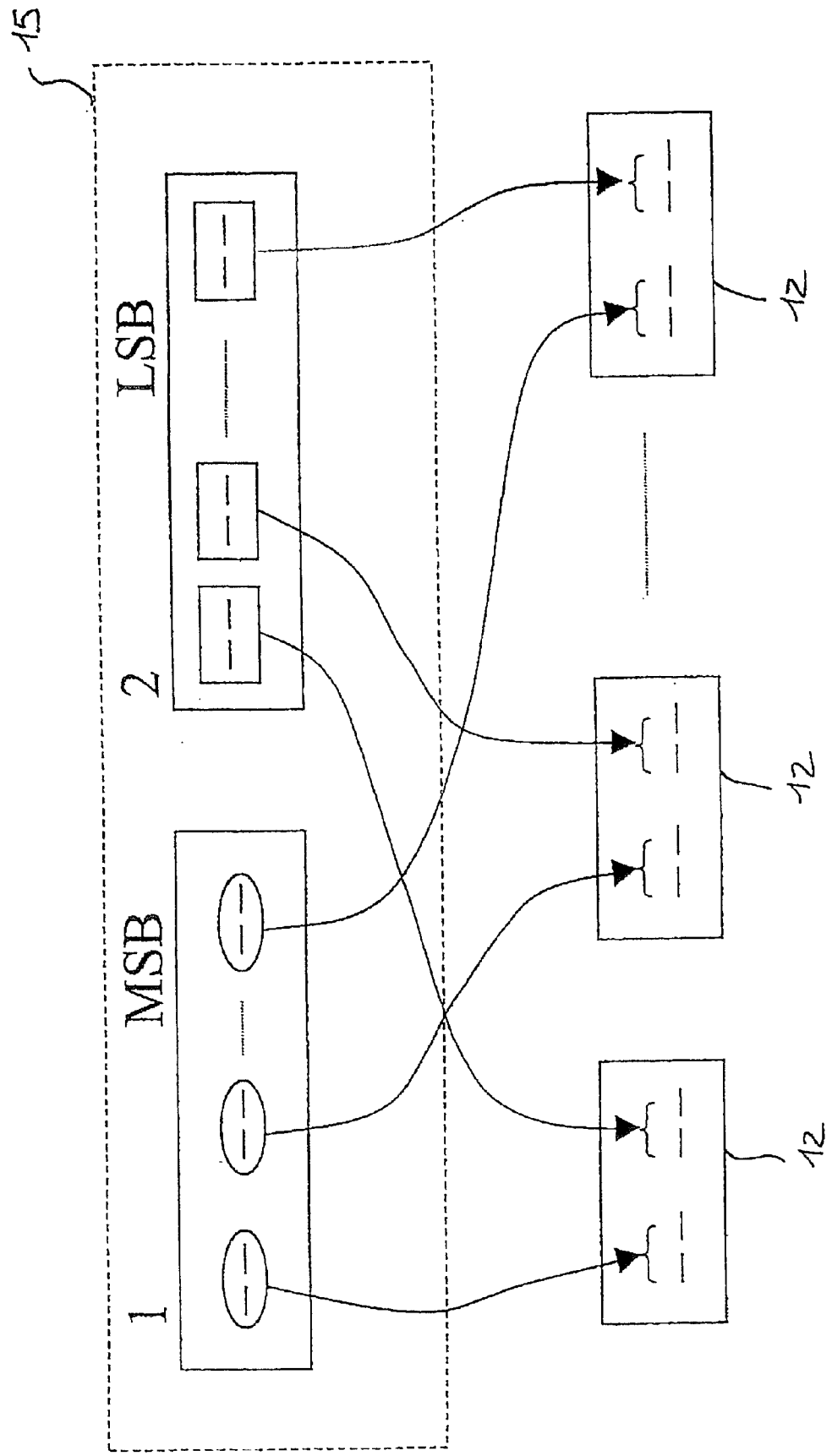
FIG. 8 shows schematically a set of multilevel memory cells which are programmed to reduce the time of latency in the synchronous read mode according to the inventive method.

The method allows an analog-to-digital conversion to be carried out of a gate voltage Vg extracted during a step of voltage-mode reading from multilevel memory cells 12, as shown schematically in FIG. 8. Each cell has a large number of levels, e.g. eight to sixteen, and the conversion method allows the informational contents of the cell 12 to be discriminated within a very short time of approximately 100 ns. Thus, the total time of asynchronously accessing the memory can be kept at approximately 150 ns, and the operation be accompanied by a small amount of "read disturb" to the cells being read.

The method affords major advantages in the respect of speed and power consumption, as explained hereinafter.

First of all, the method uses time continual, as against time discrete, converters. This minimizes the sensing time at reading, and with it, the total access time. Time continual converters, in fact, can discern in time the sample-and-hold step from the conversion step proper.

By using a time continual converter, the A/D conversion can be initiated during the read transient, that is during the rise/fall phase of the gate voltage Vg. The digital information is made available immediately upon expiration of the sensing transient.

Figure 1:
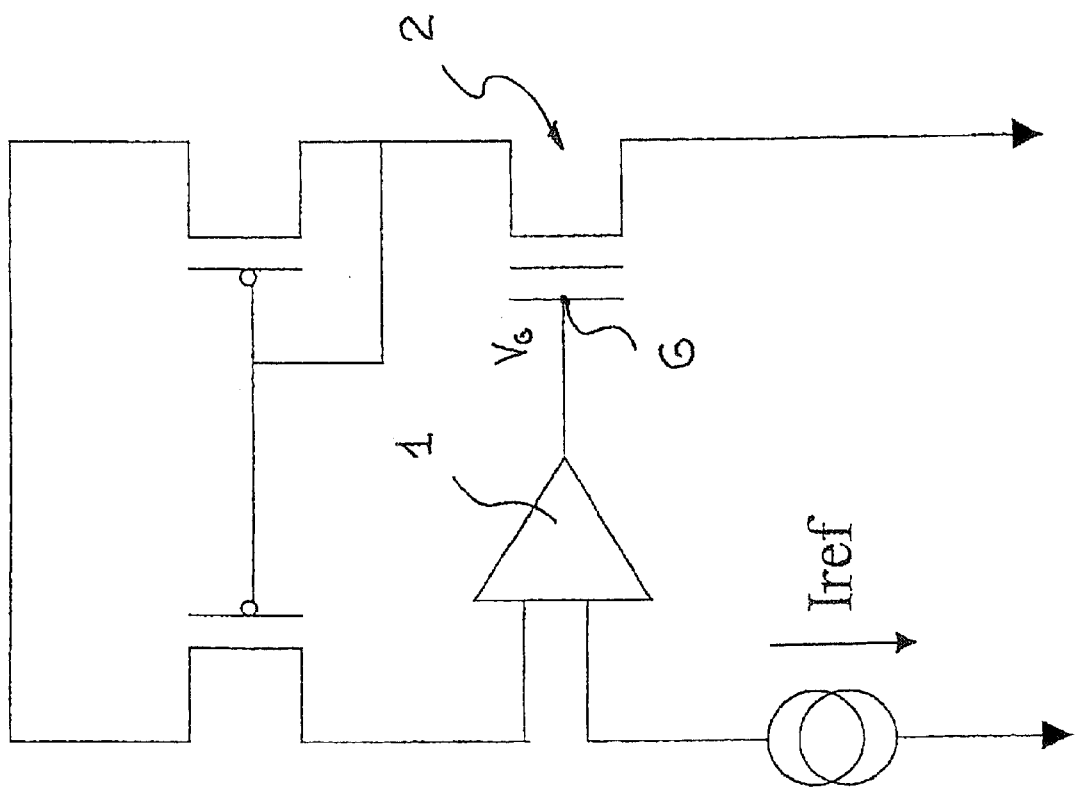
FIG. 1 shows schematically an example of a sense amplifier negative-feedback looped to the gate terminal of a memory cell.
Figure 2:
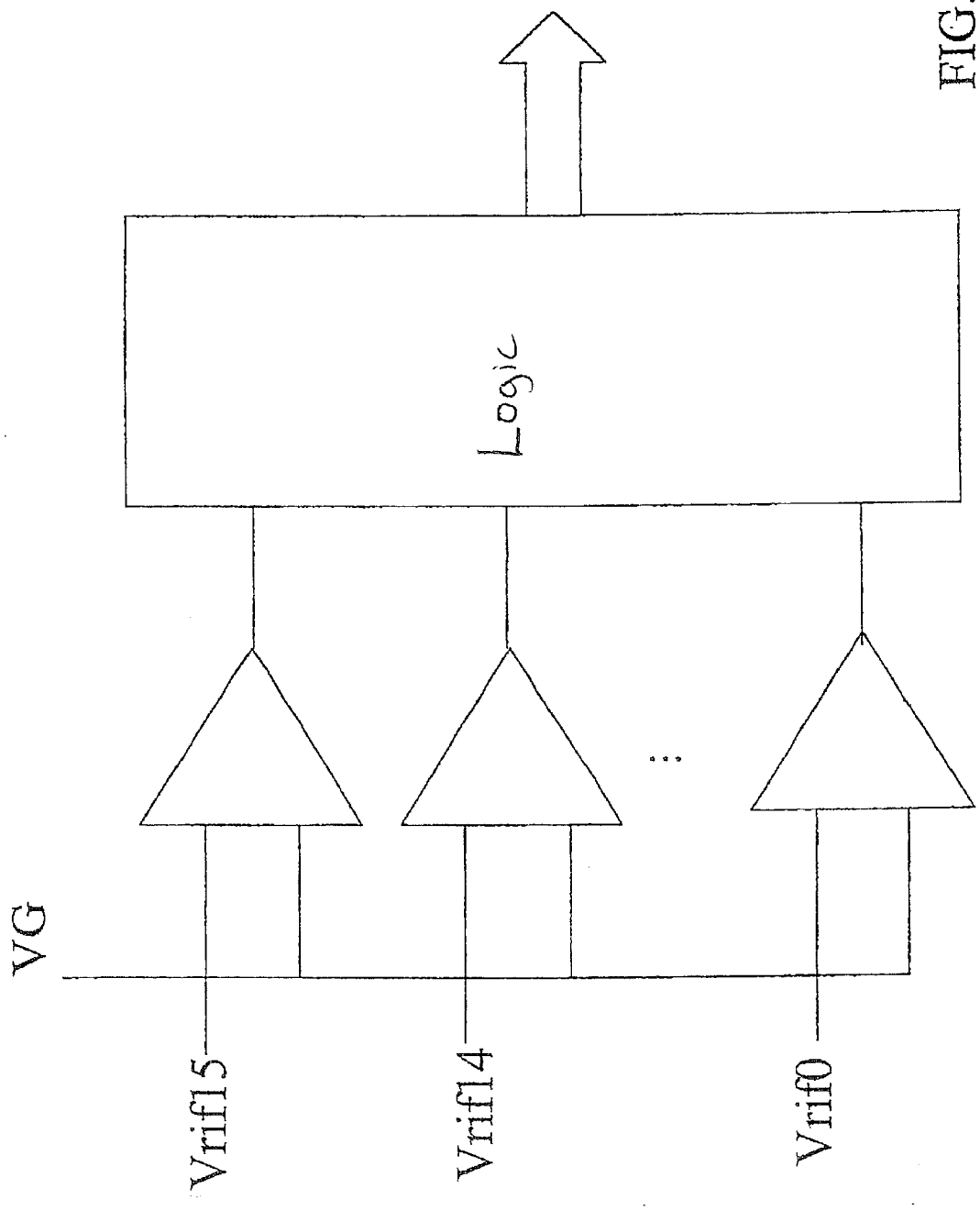
FIG. 2 shows a schematic example of a conventional flash A/D converter.
Figure 3:
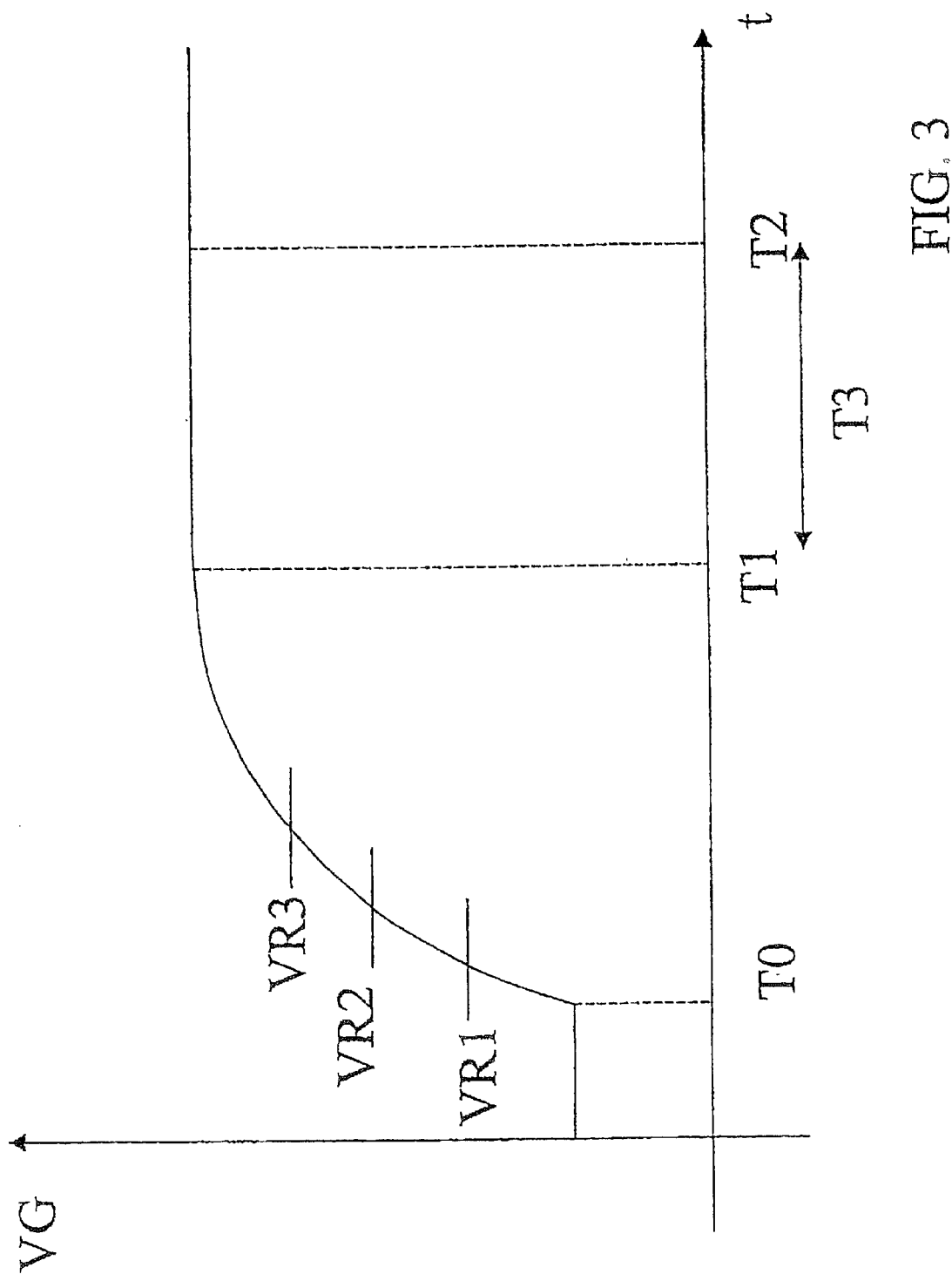
FIG. 3 illustrates schematically the pattern of the gate voltage Vg of a memory cell being read, versus time.

For a more exhaustive explanation of the A/D conversion method according to the invention, reference can be made to FIG. 3, which illustrates schematically the behavior against time of the gate voltage VG of the cell being read.

It should be recalled here that the invention is intended primarily for application to non-volatile memories operated in the voltage read mode, although the invention principle can be useful in different applications as well.

The gate voltage Vg may take the pattern shown in FIG. 3, wherein the time T0 is the point in time when the reading or sensing step is initiated.

The time T1 marks the expiration of a settling time period of the gate voltage Vg, within a ripple range of 5 mV.

The difference T3 between the time T2 and the time T1 (T2−T1=T3) represents a conventional A/D conversion duration, i.e. a time interval wherewithin the converter is to provide the signal detected during the reading step. The shortest possible time interval T3 has currently been achievable only with flash-type converters.

Advantageously, the analog-to-digital conversion is split into two separate steps.

In a first step, a conversion of the most significant bits MSB is carried out within the time interval given by the difference T1–T0, that is during the rise transient of the gate voltage Vg, or sensing step.

In the second step, which follows the first in time, a conversion of the least significant bits LSB is carried out during the time interval T3 that represents the holding step.

As a result, the digital datum, e.g. of four bits, will be available within T3.

In essence, despite two separate conversion steps being carried out, the time taken is comparable with that of a flash type of A/D conversion.

How this is achieved is explained in greater detail herein below.

Figure 4:
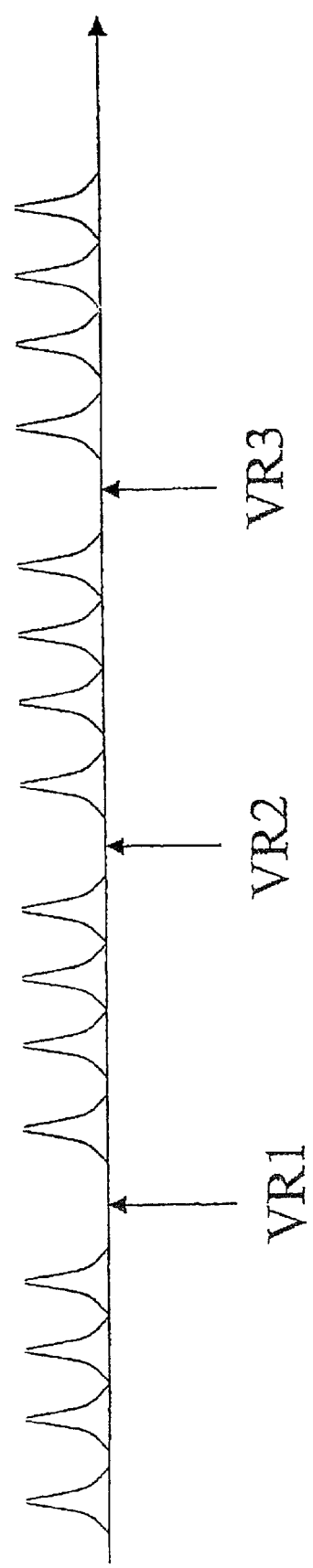
FIG. 4 illustrates schematically a set of spaced-apart reference voltage values.

Reference voltages VR are used for the purpose. Three reference voltages VR1, VR2 and VR3 are defined in the preferred embodiment described herein by way of non-limiting example. This is achieved by suitably programming the reference voltages and spacing them apart such that each of them will encompass four distributions, as shown schematically in FIG. 4.

The voltage references VR1, VR2 and VR3 are compared with the gate voltage Vg through its evolution, that is during its rise transient to the settled value.

The comparison is effected by corresponding voltage comparators, designated CM1, CM2 and CM3 in FIG. 5.

The outcome of the comparison is communicated to a logic 11 which will output the most significant bits, MSB, in this example the first two bits D3 and D2 of the information stored in the cell 12.

Advantageously, the outcome of the comparison will also identify the set of voltage references which are associated with the affected cell by the reading step. In other words, this comparison step provides an indication of the set of voltage distributions to which the cell belongs, so that the first two conversion bits can be obtained and the set of references, to be used for identifying the cell level and the other two bits, can be found.

The logic 11, additionally to outputting the two most significant bits MSB, delivers control signals to a selection block 13, which block will select the affected set of references to carry out the second conversion step wherein the other two, least significant LSB bits D1 and D0, can be obtained. Thus, the informational contents of the cell is actually translated into four bits: D3, D2, D1, D0. In particular, the control signals are essentially internal reference voltages for use in the second step for the purpose of locating a given cell inside the set that have been identified in the first step.

In the example of FIG. 5, the second step uses another three comparators CS1, CS2 and CS3, additionally to those used in the first conversion steps.

A logic 14, being quite similar to the logic 11, is connected in downstream of the comparators CS1, CS2, CS3 to obtain the values of the least significant bits LSB.

Figure 6:
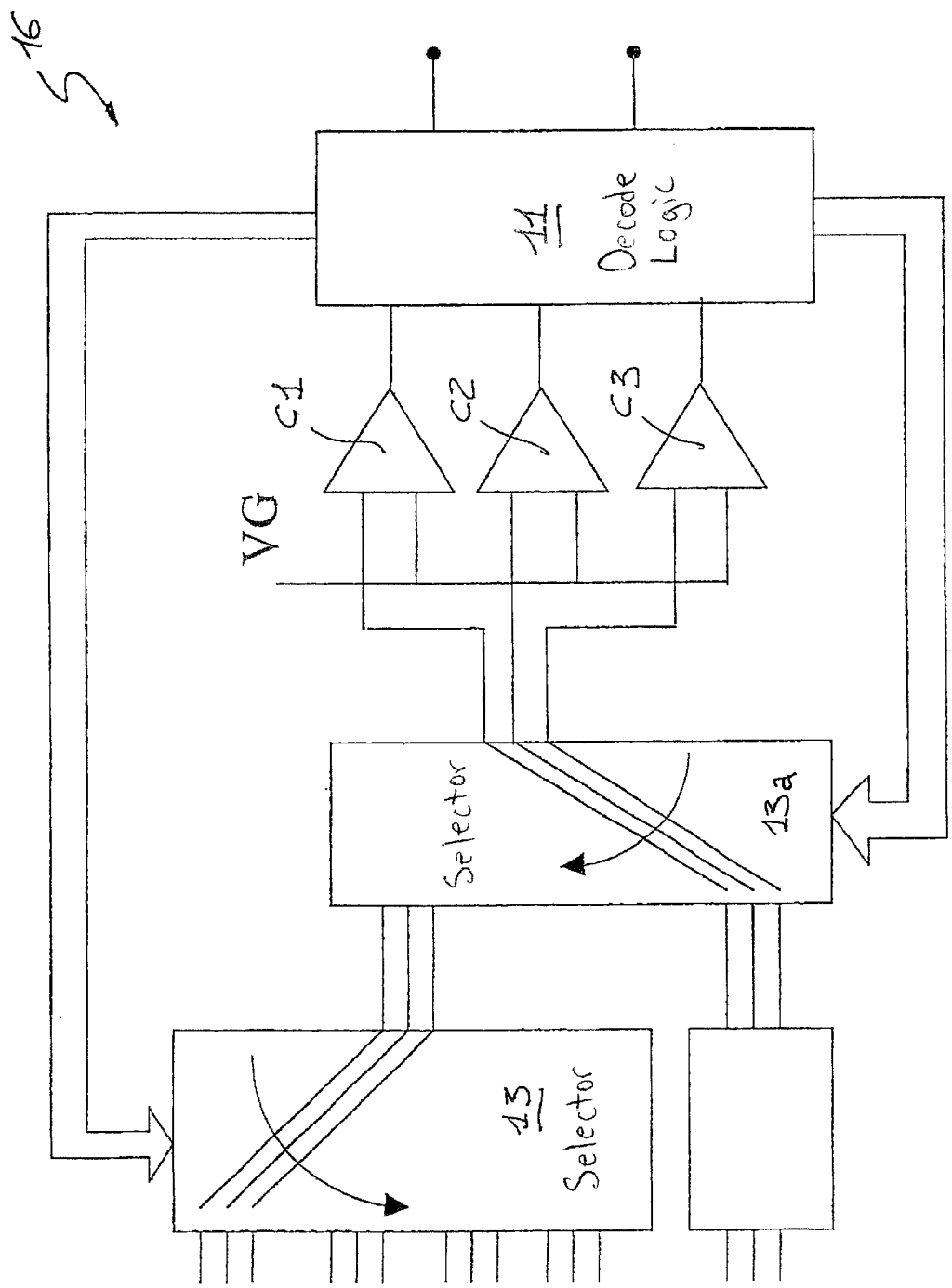
FIG. 6 shows another embodiment of the device in FIG. 5.
Figure 7A:
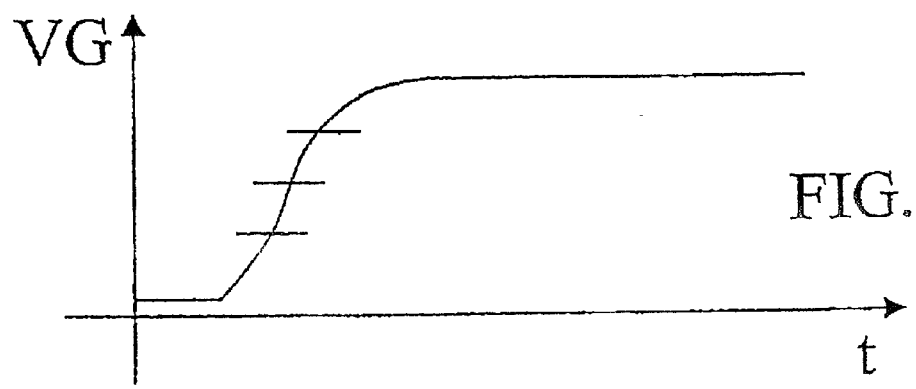
FIGS. 7A, 7B, 7C and 7D are respective plots illustrating how the gate voltage of a memory cell being read varies against time.
Figure 7B:
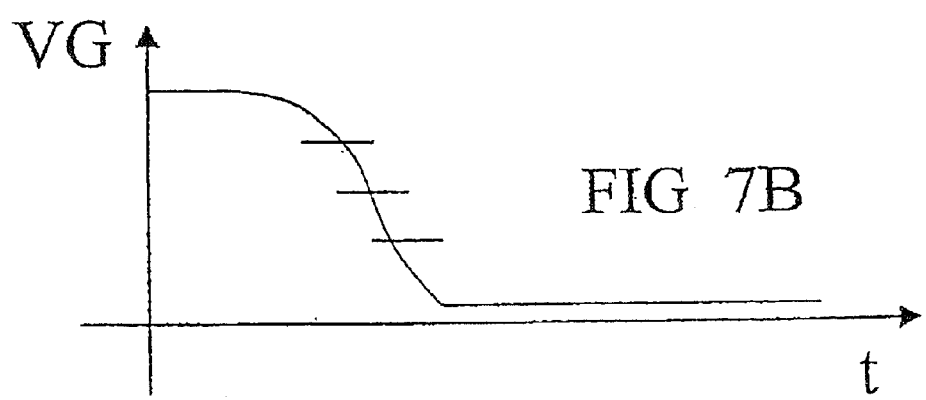
Figure 7C:
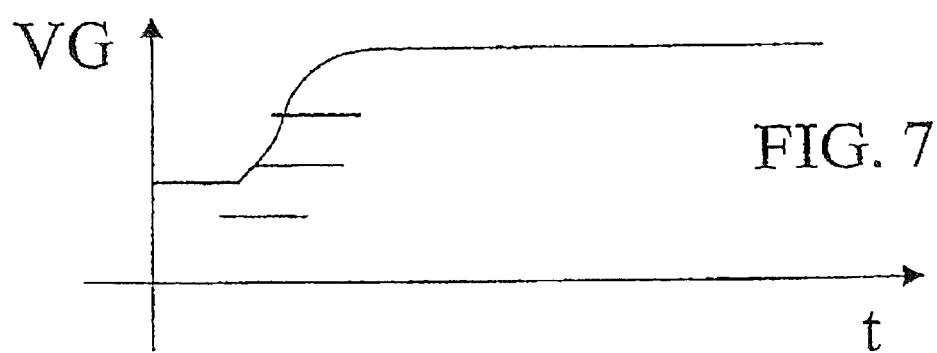
Figure 7D:
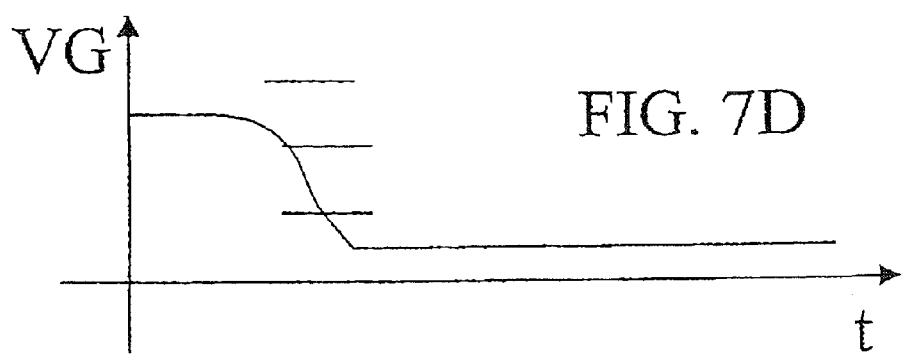

Another example of the conversion device 16 is shown in FIG. 6 which uses the three voltage comparators C1, C2, C3 both during the first and the second conversion step. In essence, the first conversion step is carried out in two periods of time: a first time period, necessary to obtain the two bits MSB, and a second time period, necessary to settle the voltage values at the various circuit nodes, comparators included. The affected selection blocks, designated 13 and 13a, are driven by the logic 11.

The conversion technique of this invention can be applied to gate voltages which change over time, as illustrated by FIGS. 7A to 7D.

It should be noted that this conversion technique, by obtaining the most significant bits MSB during the transient (equal to T1/2) of the gate voltage Vg, allows the latency time to be reduced, in the instance of synchronous reading, in those memories which are organized in the page mode.

Referring to the schematics of FIG. 8, assume for example a circuit portion 15 intended for writing into the cells (write buffer) and comprising at least two memory words, with each word comprising sixteen bits.

The eight cells, which are to contain thirty two bits in all, should be programmed such that pairs of bits of the first word will form the most significant bits MSB of the eight cells and pairs of bits of the second word form the least significant bits LSB of the eight cells. This procedure is shown schematically in FIG. 8, which brings out the exchange method whereby information can be stored into the eight cells that form two memory words.

Figure 9:
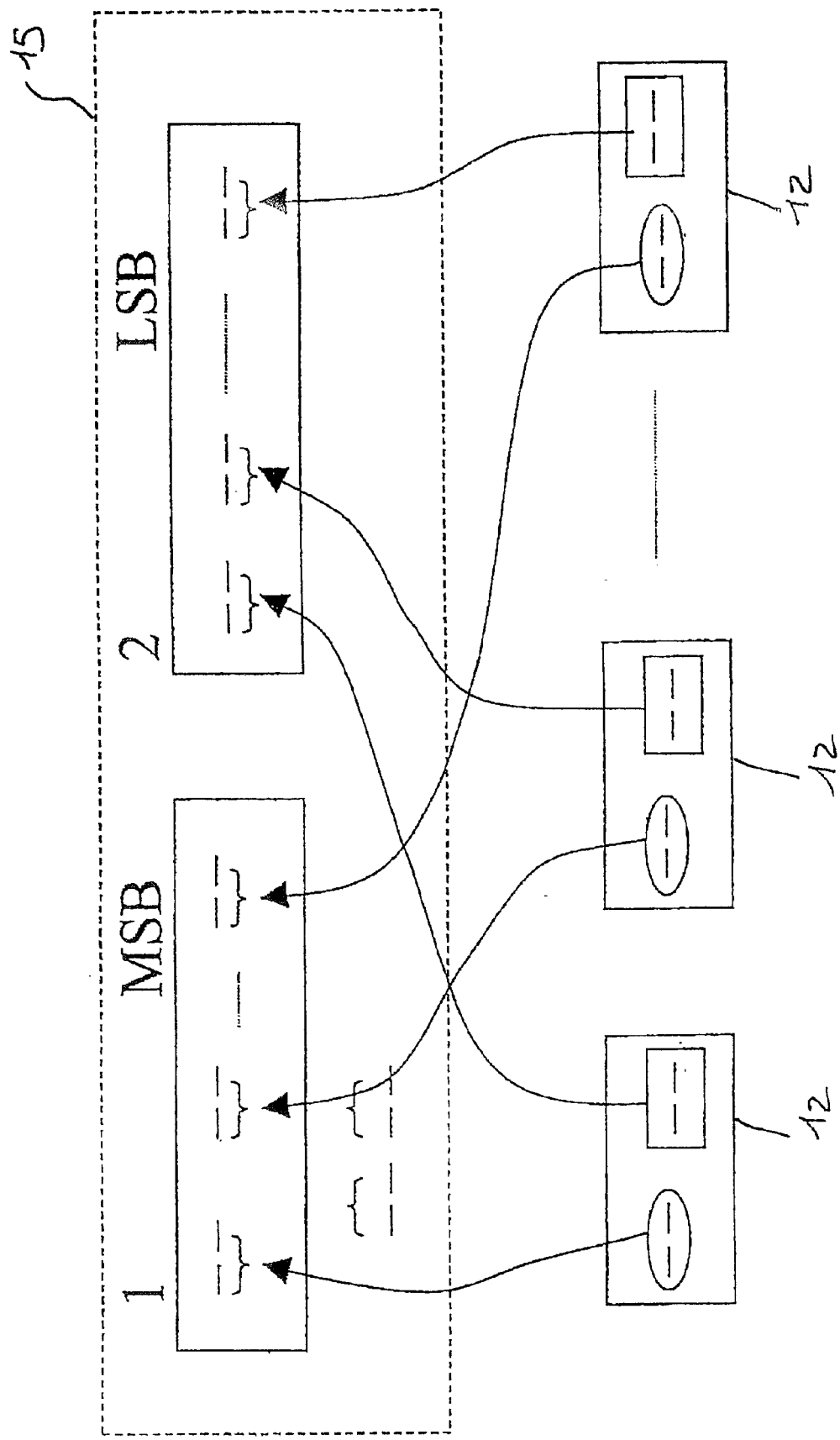
FIG. 9 shows schematically the set of cells of FIG. 8 during the reading step.

A similar situation occurs when the memory word is read, just as shown in FIG. 9.

From the last two examples given hereinabove, it can again be evinced that the total time for obtaining the conversion bits is substantially the same as that of a flash A/D technique. The actual speed will only be dependent on the comparator own speeds, which allows the memory access time to be reduced.

Furthermore, circuit area occupation and power consumption will be minimized, even in the instance of heavy parallelism, that is in the event of several memory cells being read simultaneously.

In the respect of area requirements, the device of this invention employs but three comparators and simple logic blocks, as against the fifteen comparators used in devices based on the flash technique.

Power consumption is obviously made lower by the smaller number of comparators used in the invention, enhanced power consumption being, in fact, ascribable to the comparators provided to meet the requirements for speed.

The A/D conversion technique described hereinabove is useful primarily with non-volatile memories, but may be used in different applications.

The method can be used for burst or page mode reading (synchronous reading), with the same parallelism of cells being read from, and the same programmed levels (nbit/cell, where n=1,2,3, . . . ), and with reduced latency time. In addition, this method allows read error correction to be carried out—an operation referred to as ECC in the art—in two stages, by first acting on the most significant bits MSB and then on the least significant bits LSB, and using the same circuit block as for the ECC operation. Thus, the circuit area reserved for ECC can be smaller, and the time for error correction reduced because of the correction time for the sequence of MSBs, followed by the sequence of LSBs, being shorter than the time for simultaneous correction of a whole word.

As previously mentioned with reference to FIGS. 8 and 9, we have taken in consideration a non-limiting example wherein the bit of the different memory cells are organized in layer and may be defined "bit-layers". If we consider a group of eight cells, each able to store four bits, the two MSB bits of each of the eight cells are owned by a single sixteen bit memory word, while the two LSB of the same cells will be owned by another memory word that is independent by the previous one.

In a conventional organization the sixteen bits are allocated in four memory cells and correspond to all of the bits of such four cells.

However, according to a method of the present invention, the proposed memory organization allows to minimize the delay time during the reading phase. The first reading step determines the two MSB of the eight cells and gives back all the bit of the first memory word that is completely read before proceeding with the reading of the two LSB of the cells, that is the second reading step.

This second reading step allows to determine the sixteen bit corresponding to the LSB of the four cells. On the contrary, in a conventional memory organization it necessary to follow both the reading steps to obtain all the bit of a single memory word.

Now, according to an embodiment of the present invention, this memory organization may be extended to the control bit when an ECC (Error Control Code) technique is used. The use of this technique improves the reliability of the memory device.

According to this technique, an information bit is associated to a control bit that is suitably coded during the storing phase and decoded during the reading phase to reconstruct the information content of the memory word even when faults are present.

Obviously, the control bits are stored in additional memory cells that will be called "control cells".

When considering again the FIGS. 8 and 9, the ECC control bit of the first memory word are stored in the two MSB of the control cells.

The control bits of the second memory word are stored in the two LSB of the same control cells.

It must be noted that in a conventional memory organization the control bit associated to a memory word, that is to say to a cells group, are allocated in such a manner to occupy all the bits of the control cells associated to that memory word.

Figure 10:
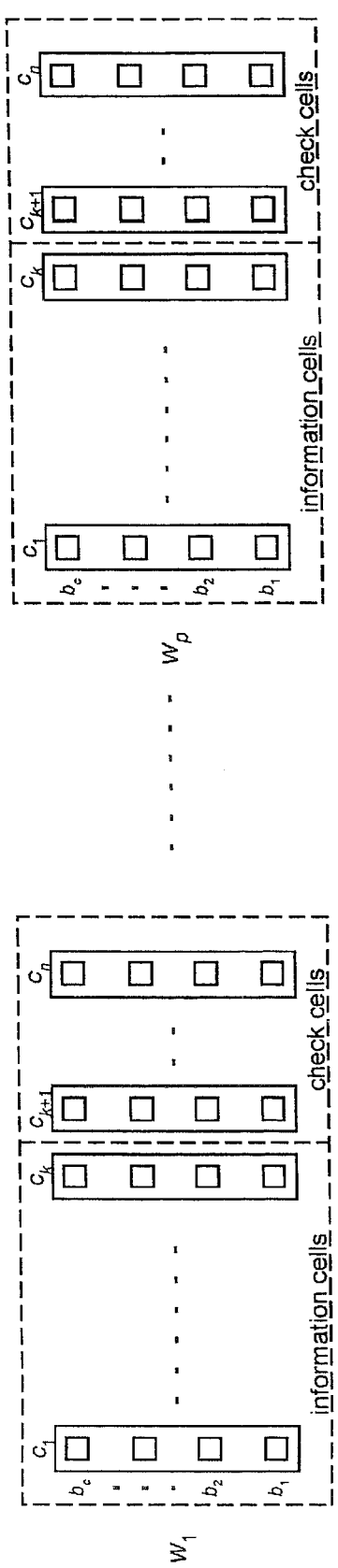
FIG. 10 is a schematic view of a conventional ECC memory organization according to the prior art.

In other words, the information bit and the control bit of a memory word are stored together in a predetermined group of cells, see for instance the enclosed FIG. 10 for a single bit-layer.

The proposed memory architecture of the method according to the present invention allows to treat the MSB and the LSB separately both in the coding phase (when writing the memory cells) and in the decoding phase (when reading the memory cells).

In this manner, the coding and decoding phases of the ECC are not performed on a group of cells including four bits as in a conventional memory organization.

On the contrary, the method according to one embodiment of the invention works on a memory word or a set of memory words formed by groups of two bit each.

This much simplifies the structure of the coding and decoding networks as will be explained hereinafter.

Moreover, when the first reading step is over, the bits of the first words (those stored in the MSB of the cells) are all available; both the information and the control bit; so, the correct information content of the first word is immediately available.

According to the prior approach, wherein the information bit and the control bit of a memory word covers all the bits of a certain number of cells, to perform an ECC decoding step all the bits of the memory cells must be available.

The method allows to reduce the delay time during the reading step.

The proposed memory organization may be used in order to allocate the bit of a memory word in "layers" including a single bit.

For instance, the sixteen information bits of a memory word will be allocated in the MSB of sixteen memory cells; the sixteen information bit of another memory word will be allocated in the other bit immediately shifted from the MSB of the same sixteen memory cells.

The sixteen information bits of a third memory word will be allocated in the still less significant bits of the sixteen memory cells. Finally, the sixteen information bits of a fourth memory word will be allocated in the LSB of the same sixteen memory cells. The control bit will be allocated in the corresponding bit layer of the control cells.

In the following lines we will explain in greater details other features of the memory organization method according to an embodiment the present invention.

The multilevel approach obviously imposes more stringent technological and design constraints with respect to conventional bilevel storage, due to the increase in the number of programmable levels to be allocated within a predetermined threshold window. Moreover, the reduced spacing between adjacent levels makes issues such as disturbs and data retention much more critical, thereby decreasing memory reliability. It is therefore deemed that on-chip error control codes (ECCs) will become mandatory for large-size multilevel Flash memories. The natural choice is the use of block codes: a predetermined number of memory cells, i.e., the cells which make up an information word.

In most cases, a key requirement for ECCs to be used in Flash memories is to minimize the time required to carry out the decoding operation, so as to have a small impact on memory access time. This leads to the use of parallel decoding techniques as reported in C. V. Srinivasan, "Codes For Error Correction In High-Speed Memory Systems-Part I: Correction Of Cell Defects In Integrated Memories", IEEE Trans. Comput vol. C-20, no.8, August 1971, pp.882–888.

In the presence of memory cells capable of storing several bits, the decoding circuitry becomes very complex and, therefore, the decoding time turns out to be critical.

To correct any c-bit error corresponding to the failure of a single multilevel cell, non-binary codes are used. Non-binary codes are based on arbitrary finite alphabets with more than two symbols: in the same way as the content of a bilevel cell is associated to a binary digit, the content of a q level cell can be associated to a q-ary digit. Therefore, a single-cell error corresponds to a single-digit error, that can be handled easily using a q-ary code. For instance, a q-ary single-error-correcting code can correct all the errors involving the c bits belonging to a single q-level cell.

An embodiment of the invention provides an ECC scheme for multilevel Flash memories based on a binary code providing single-bit correction, which has a better correction capability than non-binary ECCs which correct any failure in a single cell. This code greatly simplifies the required encoding and decoding networks and minimizes the impact on memory access time. Moreover, the presented scheme can be applied to multilevel memories with cells working at a variable number of levels (i.e., with a variable number of bits stored per cell), thereby ensuring the required data protection in each operating mode by exploiting the same encoding and decoding circuits and check cells.

In a conventional multilevel Flash memory organization, the c bits of a single memory cell belong to the same word, so that k cells are used to store a word of c·k bits. When using ECCs, the same approach is extended to the check cells: the m check cells required belong to the same codeword, which is therefore made up of n=k+m cells (FIG.

10). In other words, a single q level cell can be considered as containing a q-ary digit rather than c=log2 q binary digits, so that a complete codeword is made up of n q-ary digits.

A general requirement is that the used ECC must be able to correct at least any error in a single multilevel cell belonging to the considered codeword, i.e., any error referred to a q-ary digit in any block of n cells (indeed, radiation or noise can upset, randomly, one or more bits). Error patterns involving two or more adjacent cells are generally recovered by a proper physical interleaving of cells belonging to the same codeword, thereby increasing overall memory reliability.

The above approach is the most straightforward, however, when the number of bits stored per cell increases, the encoding and decoding circuits can become very complex. This leads to large area occupation and to excessive decoding time, which can exceed the allowed time budget.

Figure 11:
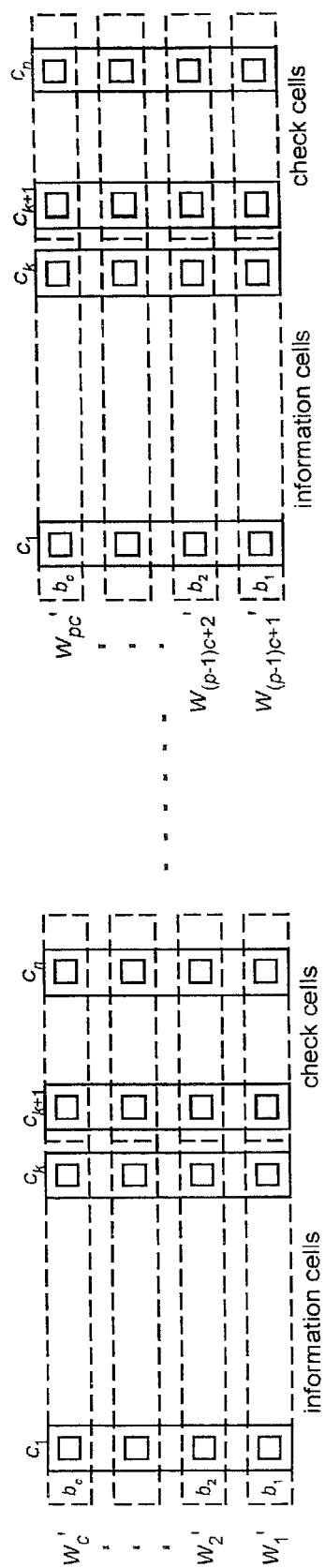
FIG. 11 is a schematic view of an ECC memory organization method according to the present invention.

The ECC scheme of this invention is illustrated in FIG. 11. The c bits stored in a single memory cell are organized in different "layers", hereinafter referred to as bit-layers, which are independent from one another. An n-bit codeword is stored in the same bit-layer of n memory cells. To be specific, in FIG. 11, word w1' is stored in the layer $b_1$ of the cells $c_1$ to $c_n$, word $w_2'$ is stored in the layer $b_2$ of the same cells as above, and so on. In such a way, n memory cells are still capable of storing c·n bits, as in the conventional organization, however, the location of these bits is different in the two cases. In practice, the whole memory array (n·p cells) can be seen as made up by c elementary memory arrays, each having the same physical size. Each elementary array corresponds to a bit-layer and contains n·p bits storing a single bit per location. The same approach is adopted for both data and check cells, in such a way that any codeword is stored in the same bit-layer of a given block of memory cells. For each bit-layer, a simple ECC capable of correcting a single-bit error in a block of n=k+m bits, is now sufficient to correct any failure in a single cell. This greatly simplifies the decoding circuitry, which results in a shorter decoding time.

Denoting the cell error probability as p the probability of having at least one cell failure in a word of k cells (i.e., the codeword error probability) is given by $$P_{CE0}=1-(1-p)^k \quad (1)$$

Using error control techniques, the codeword error probability decreases. Codes capable of correcting 1 failed cell reduce this probability to $P_{CE1}$ $$P_{CE1}=1-(1-p)^{n_1}-n_1 p(1-p)^{n_1-1} \quad (2)$$

In the above equation, n1 represents the number of digits in a codeword, which is equal to k plus the number of required check digits.

In the proposed solution, the codeword error probability is reduced since more failed cells (namely, up to c can be corrected, provided that at most one error is present in each bit-layer. The codeword error probability is given by $$P_{CE2} = 1 - (1-p)^{n_2} - \sum_{i=1}^{c}\left\{\frac{n_2!}{(n_2-i)!}\left(\frac{p}{2^c-1}\right)^i (1-p)^{n_2-i} \sum_{j=i}^{c}\left[\binom{c}{j}\binom{j-1}{i-1}\right]\right\} \quad (3)$$

assuming a uniform error probability between the $2^c$ possible cell states: that is, the transition probability from the cell state $s_1$ to the cell state $s_j$ (with i, j ∈ {1, . . . ,$2^c$}, i≠j is equal to $p/(2^c-1)$. In this case, the reduction in the codeword error probability is about 5% considering, for example, k=64, $n_1$=67, n2=71 and p≈$10^{-4}$.

A further improvement in the codeword error probability is obtained by using a G ray coding for the cell contents. This minimizes the probability of having more than one failed bit, since in multilevel cells the error corresponding to the jump of a single level is more probable than any error involving the jump of several levels and, with G ray coding, the jump of a single level is associated to the switch of a single bit.

The presented scheme is applicable to parallel sensing which, at present, is the most common architectural approach for memory reading. With this approach, the information contents of the n cells is available in a single reading step and, therefore, the n·c codeword bits can be processed simultaneously by c identical decoding circuits working in parallel. A very short time is required to extract the correct information, which minimizes the penalty in access time.

However, the proposed organization is also very well suited when a serial-dichotomic sensing architecture is used. This sensing technique detects the c bits stored in any memory cell sequentially, according to a successive approximation approach: c sensing steps are required for complete cell reading, as one bit is detected at each step. This sensing approach requires simpler sensing circuits and lower power consumption as compared to parallel sensing, and is very attractive especially for burst-mode read operation.

The conventional organization for data and check cells implies that the whole contents of the cells under reading must be detected before beginning the decoding operation. When using dichotomic sensing, the correct data are therefore available after c+1 clock cycles, assuming that the ECC decoding is carried out in a single clock period. By contrast, with the proposed ECC scheme, the bits belonging to each bit-layer can be processed by the ECC decoding logic as soon as they are detected by the sensing circuits, as shown in FIG. 12.

Figure 12:
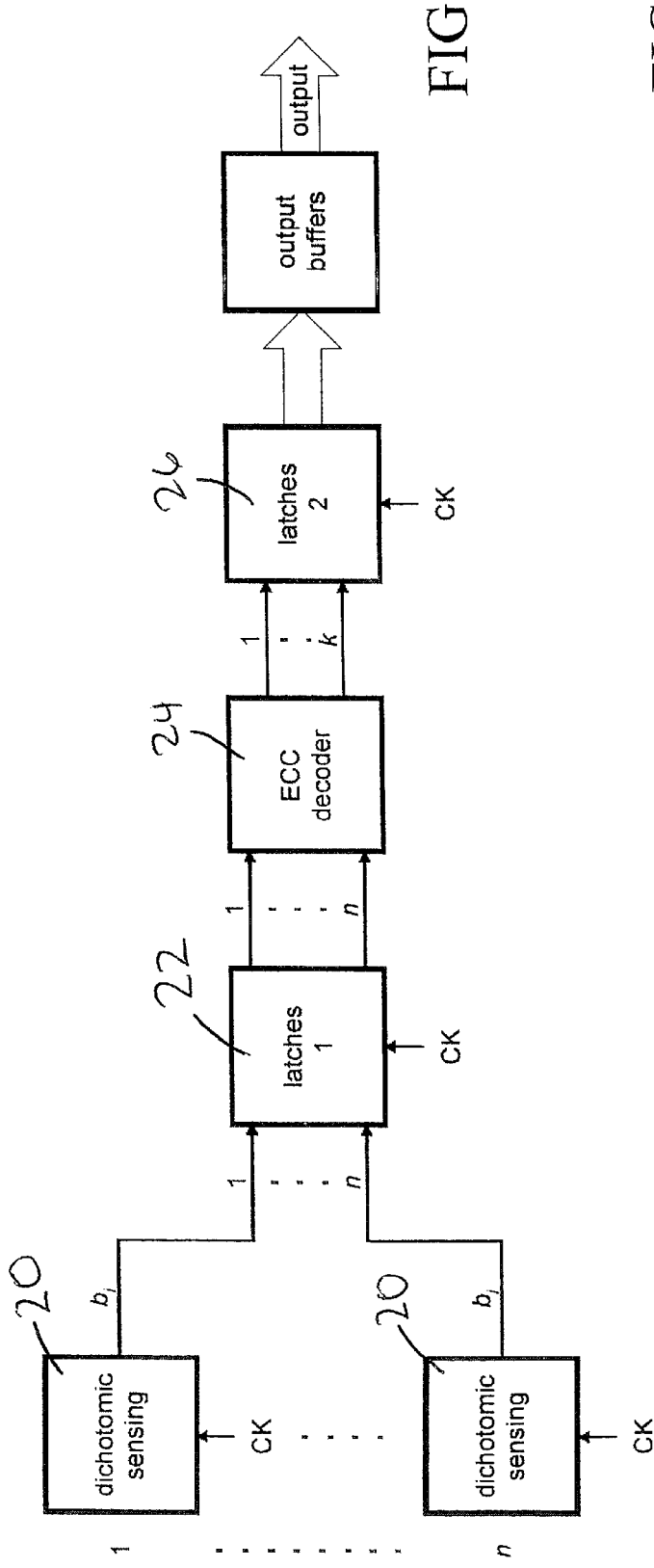
FIG. 12 is an error correction scheme according to a dichotomic sensing approach of the present invention.

As shown in FIG. 12, n dichotomic sensing blocks (read circuits) 20 read the addressed bit-layer of addressed memory cells, including control bit memory cells, and output the read bits $b_1$ of the bit-layer to a first set of latches 22. An ECC decoder 24 accesses the bits in the first set of latches 22, uses the control bits to correct any single bit errors in the information bits, and outputs the k information bits to a second set of latches 26. The second set of latches 26 then passes the k information bits to a set of output buffers 28 which outputs the information bits to the program that request the memory cells to be read.

At each clock pulse, the bits of a new bit-layer are stored in the first latch bank and are therefore immediately ready for ECC decoding.

In addition, it should also be recalled that the decoding time for each codeword is shorter. Moreover as shown in FIG. 12, a single decoding network is sequentially employed for the sensed codewords as soon as each of these is ready, which leads to power consumption reduction and silicon area saving. Finally it is apparent that the same circuitry can provide ECC correction when the memory operates with a different values of bits per cell.

Figure 13:
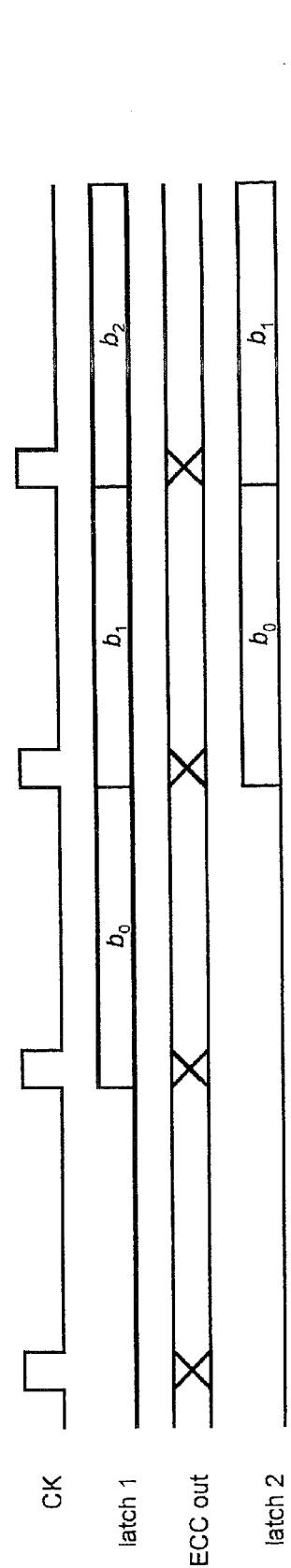
FIG. 13 is a comparative voltage vs. time diagram of some signals used in the sensing approach of FIG. 12.

As shown in FIG. 13, to compare the performance of the proposed and the conventional scheme, the ECC coding and decoding networks were designed for a 0.25 µm CMOS process, referring to the case of 4-level cells (i.e., 2 bits per cell) and 16-level cells (i.e., 4 bits per cell). We set the number of data cells k equal to 64 for both the cases.

In the case of 4-level cells, we compared the proposed solution with ECC schemes based on non-binary shortened Hamming codes operating on 4-ary digits. These codes are capable of correcting any failure in a single cell within a block, while the proposed one is capable of correcting any bit failure within a bit-layer.

The first considered Hamming code is the (36, 32) q-ary code (i.e., n=36, k=32, q=4). In this case we assumed to split the 64 data cells in two blocks of 32: the coding and decoding operations can be carried out sequentially using a single ECC circuit or in parallel providing two identical ECC circuits. The second considered Hamming code is the (68, 64) q-ary code (i.e., n=68, k=64, q=4).

The enclosed Table 1 shows the results of the synthesis of ECC circuits obtained starting from the VHDL description. The circuitry for the proposed code requires 523 equivalent gates, while for the Hamming codes the required gate count is 624 for the (36,32) code and 1356 equivalent gates for the (68, 64) code. The total decoding time is reduced from 7.5 ns or 8.3 ns in the conventional organizations to 6.7 ns in the proposed one.

TABLE 1

Comparison between the proposed and conventional ECC approaches for 2-bit/cell storage.

|  | proposed code | (36, 32) 4-ary symbols | (68, 64) 4-ary symbols |
| --- | --- | --- | --- |
| number of data cells (k) | 64 |  | 64 |
| number of check cells (m) | 7 | 4 | 4 |
| operating modes (bit/cell) | 1.2 | 2 | 2 |
| number of required ECC decoders for 64 data cells | 2 | 2 | 1 |
| coder gate count | 278 | 296 | 738 |
| syndrome evaluation and error correction block gate count | 245 | 328 | 618 |
| total decoder gate count | 523 | 624 | 1356 |
| coding delay | 2.5 ns | 2.9 ns | 3.5 ns |
| syndrome evaluation and error correction delay | 4.2 ns | 4.6 ns | 4.8 ns |
| total delay for decoding operation | 6.7 ns | 7.5 ns | 8.3 ns |

In the case of 16 levels cells, the proposed solution was compared with the 16-ary Hamming code (67, 64) (i.e., n=67, k=64, q=16).

The enclosed Table 2 compares the results of the synthesis of the proposed solution with the circuit related to the Hamming code. For this code the required gate count is 2 949 and the total decoding time is 13.3 ns.

TABLE 2

Comparison between the proposed and a conventional ECC approach for 4-bit/cell storage.

|  | proposed code | (67, 64) 16-ary symbols |
| --- | --- | --- |
| Number of data cells (k) | 64 | 64 |
| Number of check cells (in) | 7 | 3 |
| Operating modes (bit/cell) | 1, 2, 3, 4 | 4 |
| number of required ECC decoders for 64 data cells | 4 | 1 |
| coder gate count | 278 | 1526 |
| syndrome evaluation and error correction block gate count | 245 | 1423 |
| total decoder gate count | 523 | 2949 |
| coding delay | 2.5 ns | 3.9 ns |

TABLE 2-continued

Comparison between the proposed and a conventional ECC approach for 4-bit/cell storage.

|  | proposed code | (67, 64) 16-ary symbols |
| --- | --- | --- |
| syndrome evaluation and error correction delay | 4.2 ns | 6.4 ns |
| total delay for decoding operation | 6.7 ns | 13.3 ns |

Figure 14:
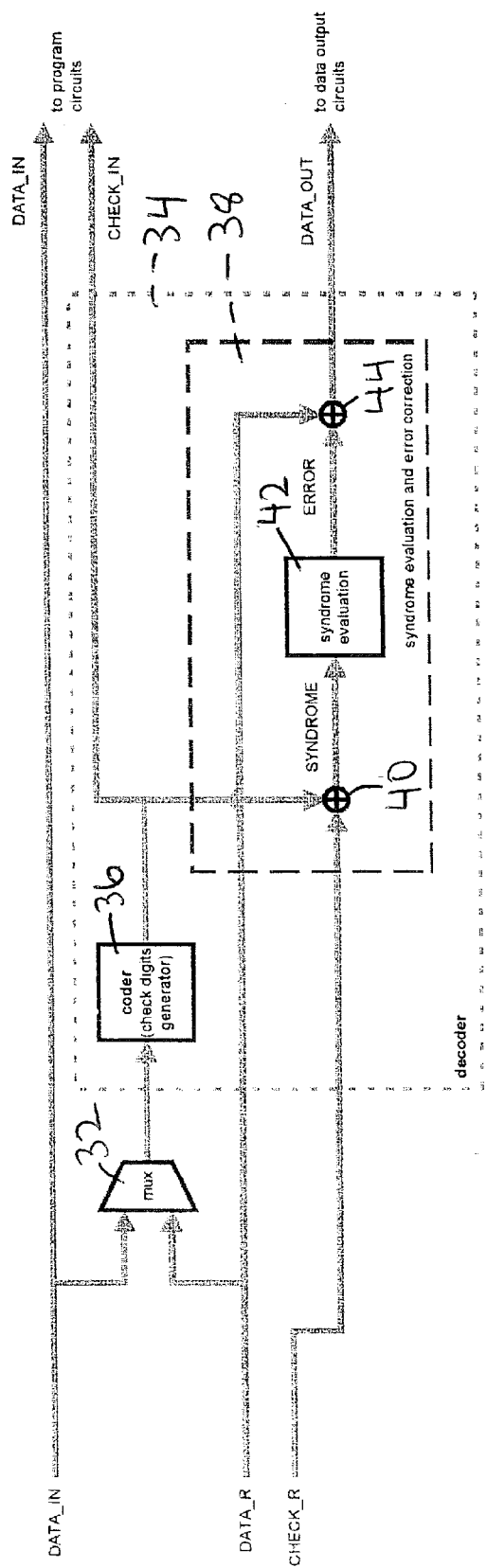
FIG. 14 is a schematic view of a block diagram of an error correction circuit according to the present invention.

FIG. 14 is a schematic view of a block diagram of an error correction circuit 30 according to an embodiment of the present invention. The error correction circuit 30 includes a multiplexer 32 having two inputs and an output connected to a decoder/encoder 34 that produces check bits for data being written (DATA_IN) into the multilevel memory and decodes data being read (DATA_R, CHECK_R) from the memory. The decoder/encoder 34 includes a coder 36 having an input coupled to the output of the multiplexer 32 and an output at which check bits are generated based on the information bits received from the multiplexer. The decoder/encoder 34 also includes a syndrome evaluation and error correction unit 38 coupled to the output of the coder 36. The syndrome evaluation and error correction unit 38 includes a first adder node 40 having first and second inputs and an output coupled to a syndrome evaluation block 42 which is coupled to a second adder block 44.

The error correction circuit 30 operates as follows when encoding information data being written (DATA_IN) into the memory. The DATA_IN is input into the multiplexer 32 which, in response to an appropriate control signal (not shown), passes the DATA_IN to the coder 36. The coder 36 generates appropriate check bits CHECK_IN from the DATA_IN using one of the error correction code schemes discussed above. The DATA_IN and CHECK_IN bits are then output to the program circuits that write the DATA_IN and CHECK_IN bits into a common layer of a set of multilevel memory cells.

To decode data being read (DATA_R, CHECK_R) from the memory, the DATA_R information bits are received by the multiplexer 32 from the memory read circuits. The multiplexer 32 passes the DATA_R information bits to the coder 36 which generates appropriate check bits CHECK_IN from the DATA_R using one of the error correction code schemes discussed above. The generated check bits CHECK_IN and the read check bits CHECK_R are passed to the first adder 40 which forwards them to the syndrome evaluation unit 42. The syndrome evaluation unit 42 determines whether the check bits CHECK_IN and CHECK_R match each other, and if they do, passes no error to the second adder 44 which simply outputs the information bits DATA_R without change. If the syndrome evaluation unit 42 finds an error, it transmits a corrected bit ERROR to the second adder 44 which outputs the information bits DATA_R modified by the corrected bit.

In conclusion, it has been presented an ECC scheme for multilevel Flash memories. The problem of complex error control coding is solved by means of simple codes providing single-bit error correction, regardless of the number of bits stored in a cell. This greatly simplifies the encoding and decoding networks, thus leading to minimum decoding time and, hence, minimizing the memory access time overhead. Moreover, it allows the same encoding/decoding circuit and check cells to be used with memories working at a variable number of bits per cell.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An analog-to-digital conversion method in a high-density multilevel non-volatile memory device that includes a multilevel memory cell having a floating gate transistor with gate, drain, and source terminals, the method comprising:

reading the memory cell by applying predetermined bias voltage values to the drain and source terminals while the drain terminal is applied a predetermined current value, and by detecting a gate voltage at the gate terminal;

a first converting step of converting the gate voltage into a plurality of most significant bits; and a second converting step that follows the first converting step, the second converting step converting the gate voltage into a plurality of least significant bits.

2. A method according to claim 1, wherein said first converting step is completed within a time interval corresponding to a rise/fall transient of the gate voltage.

3. A method according to claim 2, wherein said second converting step is initiated at an end of the transient.

4. A method according to claim 1, wherein the gate voltage is compared with a predetermined set of reference voltages having values at suitable intervals from one another during said first converting step.

5. A method according to claim 4, wherein second converting step comprises a comparison of the gate voltage with another set of internal reference voltage values.

6. A method according to claim 1, wherein said first converting step is carried out as two time periods: a first period to obtain the most significant bits and a second period for settling voltage values at various circuit nodes of a conversion device that implements the method.

7. An analog-to-digital conversion device incorporated in a high-density multilevel non-volatile memory device that includes a multilevel memory cell having a floating gate transistor with gate, drain, and source terminals, the device comprising:

a plurality of voltage comparators, each having a first input coupled to the gate terminal, a second input maintained at a corresponding reference voltage value, and an output, each voltage comparator being a time continual comparator;

a logic block connected to the outputs of the voltage comparators and structured to extract most significant bits of the memory cell; and means for initiating analog-to-digital conversion of an analog voltage of the memory cell during a read transient phase.

8. A device according to claim 7, wherein the number of said voltage comparators is equal to number n of bits per cell minus one.

9. An analog-to-digital conversion device incorporated in a high-density multilevel non-volatile memory device that includes a multilevel memory cell having a floating gate transistor with gate, drain, and source terminals, the device comprising:

a plurality of voltage comparators, each having a first input coupled to the gate terminal, a second input maintained at a corresponding reference voltage value, and an output, each voltage comparator being a time continual comparator;

a first logic block connected to the outputs of the voltage comparators and structured to extract most significant bits of the memory cell; and a selection block, connected downstream of the first logic block, effective to select additional reference voltage values for application to corresponding additional comparators provided for a subsequent second conversion step in order to extract least significant bits of the memory cell by means of another logic block being connected to outputs of the additional comparators.

10. A device according to claim 9, wherein the number of said additional voltage comparators is equal to a number n of bits per cell minus one.

11. A device according to claim 9, wherein said additional comparators are coincident with said comparators, and an additional selection block is connected between said selection block and said comparators and is controlled by said logic.

12. A device according to claim 7, wherein the comparators include three comparators.

13. A multilevel memory device, comprising:

a multilevel first memory cell that stores an analog first storage value;

a multilevel second memory cell that stores an analog second storage value;

an analog-to-digital conversion device coupled to the first and second memory cells and including means for converting the first storage value into first and second information bits of first and second information words, respectively, and means for converting the second storage value into first and second error control bits of the first and second information words.

14. The memory device of claim 13 wherein the means for converting the first storage value includes a plurality of voltage comparators, each having a first input coupled to the gate terminal, a second input maintained at a corresponding reference voltage value, and an output connected to a logic block for extracting most significant bits of the first memory cell.

15. The memory device of claim 14, wherein the comparators are time continual comparators, and the A/D conversion is initiated during a read transient phase.

16. The memory device of claim 14, wherein the number of said voltage comparators is equal to a number n of bits per cell minus one.

17. The memory device of claim 14, wherein the means for converting the second storage value includes a selection block, connected downstream of the logic block, effective to select additional reference voltage values for application to corresponding additional comparators provided for a subsequent second conversion step in order to extract the error control bits of the second memory cell by means of another logic block being connected to outputs of the additional comparators.

18. The memory device of claim 17, wherein the number of said additional voltage comparators is equal to a number n of bits per cell minus one.

19. The memory device of claim 14, wherein the means for converting the second storage value includes a selection block, connected downstream of the logic block, effective to select additional reference voltage values for application to the voltage comparators.

* * * * *